(12) United States Patent  
Moon et al.

(10) Patent No.: US 8,310,881 B2
(45) Date of Patent: Nov. 13, 2012

(54) SEMICONDUCTOR DEVICE TESTING MEMORY CELLS AND TEST METHOD

(75) Inventors: Joung-wook Moon, Hwaseong-si (KR); Kwun-soo Cheon, Seoul (KR); Jung-sik Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 240 days.

(21) Appl. No.: 12/753,186

(22) Filed: Apr. 2, 2010

(65) Prior Publication Data
US 2010/0254196 A1    Oct. 7, 2010

(30) Foreign Application Priority Data
Apr. 2, 2009  (KR) .................. 10-2009-0028536

(51) Int. Cl.
*G11C 7/10*    (2006.01)
(52) U.S. Cl. ................................. 365/189.03
(58) Field of Classification Search .............. 365/189.03
See application file for complete search history.

(56) References Cited

U.S. PATENT DOCUMENTS

| 5,774,472 | A  | * | 6/1998 | Matsuoka | .................. 714/718 |
| 6,323,664 | B1 | * | 11/2001 | Kim et al. | ............... 324/754.07 |
| 8,051,342 | B2 | * | 11/2011 | Iioka | ........................ 714/718 |

FOREIGN PATENT DOCUMENTS

| JP | 05275621 A | 10/1993 |
| JP | 2006201005 A | 8/2006 |
| KR | 1020040000254 A | 1/2004 |

* cited by examiner

*Primary Examiner* — Huan Hoang
*Assistant Examiner* — Pablo Huerta
(74) *Attorney, Agent, or Firm* — Volentine & Whitt, PLLC

(57) ABSTRACT

Disclosed are a semiconductor device capable of testing memory cells and a test method. The semiconductor device includes a plurality of terminals, each terminal being configured to receive similar data during a test mode, a plurality of buffers, each buffer being configured to receive data from a corresponding terminal and output either the data or changed data to a corresponding memory cells in response to a control signal, and a control unit configured to generate a plurality of control signals, each control signal being respectively applied to a corresponding buffer.

12 Claims, 3 Drawing Sheets

SEMICONDUCTOR DEVICE TESTING MEMORY CELLS AND TEST METHOD

CROSS-REFERENCE TO RELATED APPLICATIONS

This application claims the benefit of Korean Patent Application No. 10-2009-0028536 filed on Apr. 2, 2009, the subject matter of which is hereby incorporated by reference.

BACKGROUND

The inventive concept relates to semiconductor devices capable of testing memory cells and related test methods.

One conventional approach to the testing of memory cells in a semiconductor memory device writes data to the memory cells, reads the data written to the memory cells, and then determines whether the read data is identical to the previously written data. A successful comparison of the read data and the write data verifies proper operation of the memory cells. However, given the large number of individual memory cells in contemporary memory devices, this approach can be quite time consuming. In order to reduce overall memory cell testing time and increase testing efficiency, multiple memory cells are simultaneously tested by writing, reading and comparing similar test data in relation to the memory cells.

SUMMARY

According to an aspect of the inventive concept, there is provided a semiconductor device comprising; a plurality of terminals, each terminal being configured to receive similar data during a test mode, a plurality of buffers, each buffer being configured to receive data from a corresponding terminal and output either the data or changed data to a corresponding memory cells in response to a control signal, and a control unit configured to generate a plurality of control signals, each control signal being respectively applied to a corresponding buffer.

According to another aspect of the inventive concept, there is provided a method of testing a plurality of memory cells in a semiconductor device, test method comprising; applying similar data to a plurality of terminals, wherein each one of the plurality of terminals is connected to a corresponding memory cell by one of a plurality of buffers, generating a plurality of control signals, each control signal being respectively applied to one of the plurality of buffers, by operation of each buffer in response to a corresponding control signal, storing received data as either data or changed data in the corresponding memory cell, and detecting whether a memory cell is defective by reading the data actually stored in the memory cell.

BRIEF DESCRIPTION OF THE DRAWINGS

Embodiments of the inventive concept will be described with reference to the accompanying drawings in which.

DESCRIPTION OF EMBODIMENTS

Embodiments of the inventive concept will now be described with reference to the accompanying drawings. However, it should be noted that the inventive concept may be variously embodied and is not limited to only the illustrated embodiments. Rather, the illustrated embodiments are presented as teaching examples. Throughout the written description and drawings, like reference numbers and labels are used to indicate like or similar elements.

Figure 1:
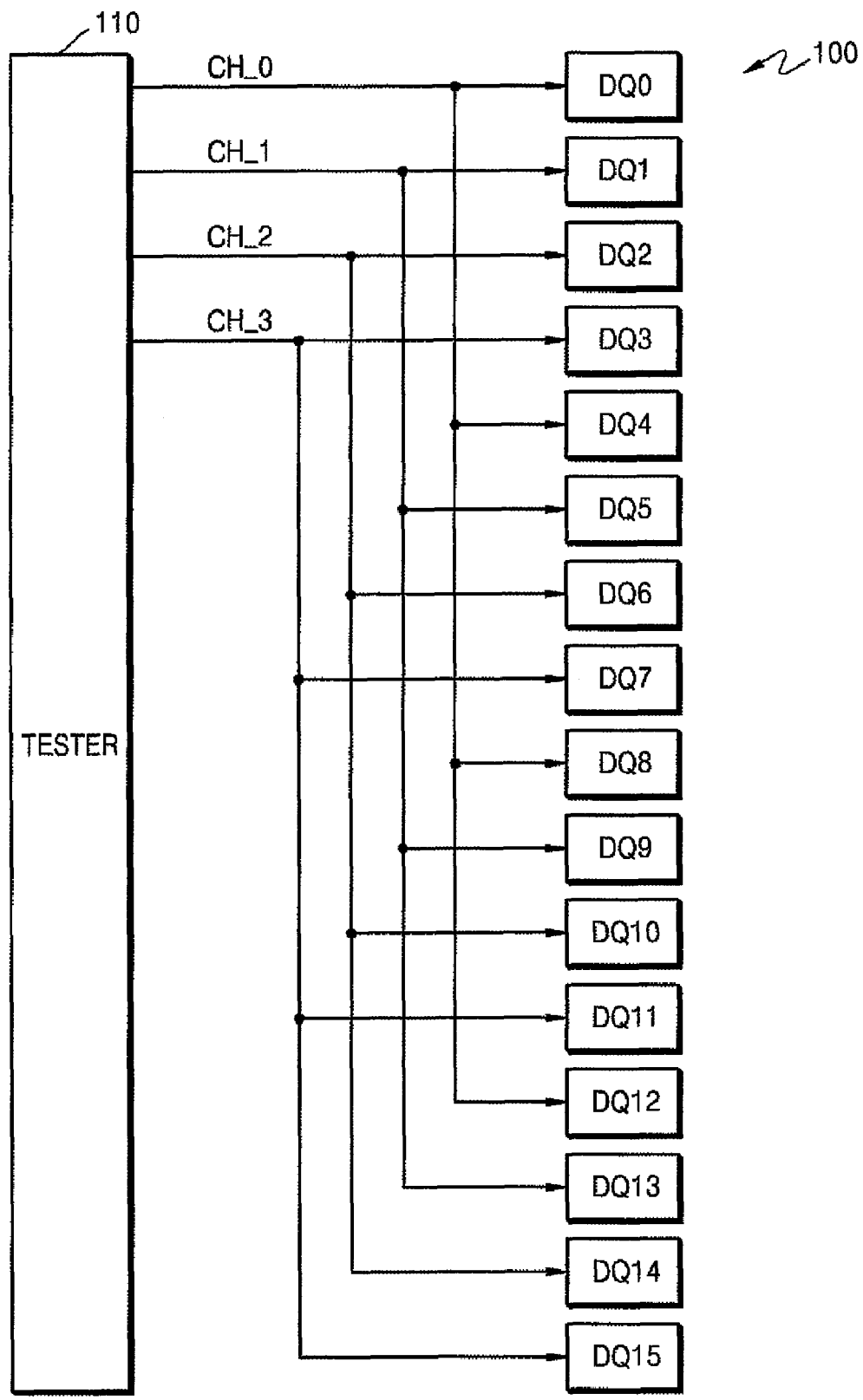
FIG. 1 is a diagram showing connections between a tester and memory device terminals according to an embodiment of the inventive concept.

FIG. 1 is a diagram showing signal line connections between a tester 110 and a plurality of terminals DQ0 through DQ15 (e.g., data input/output (I/O) pins or data strobe pins) for a semiconductor device according to an embodiment of the inventive concept. The exemplary connection scheme shown in FIG. 1 assumes sixteen (16) terminals DQ0 through DQ15 connected between four (4) channels CH_0 through CH_3, but this is just one example of many connections schemes contemplated by embodiments of the inventive concept.

Thus, the embodiment of FIG. 1 shows a case wherein four (4) terminals are respectively connected to each channel. More particularly in the illustrated embodiment of FIG. 1, a first group of logically combined terminals DQ0, DQ4, DQ8, and DQ12 is connected to a first channel CH_0; a second group of logically combined terminals DQ1, DQ5, DQ9, and DQ13 is connected to a second channel CH_1; a third group of logically combined terminals DQ2, DQ6, DQ10, and DQ14 is connected to a third channel CH_2; and a fourth group of logically combined terminals DQ3, DQ7, DQ11, and DQ15 is connected to a fourth channel CH_3. Each of the foregoing terminal groups comprises a respective first, second, third and fourth terminal. For example, the first group of terminals includes first through fourth terminals DQ0, DQ4, DQ8, and DQ12. Hereafter, an exemplary memory cell defect test will be described, wherein similar data (i.e., data having the same digital value) is applied to each one of the first through fourth terminals DQ0, DQ4, DQ8, and DQ12 of the first group of terminals.

Figure 2:
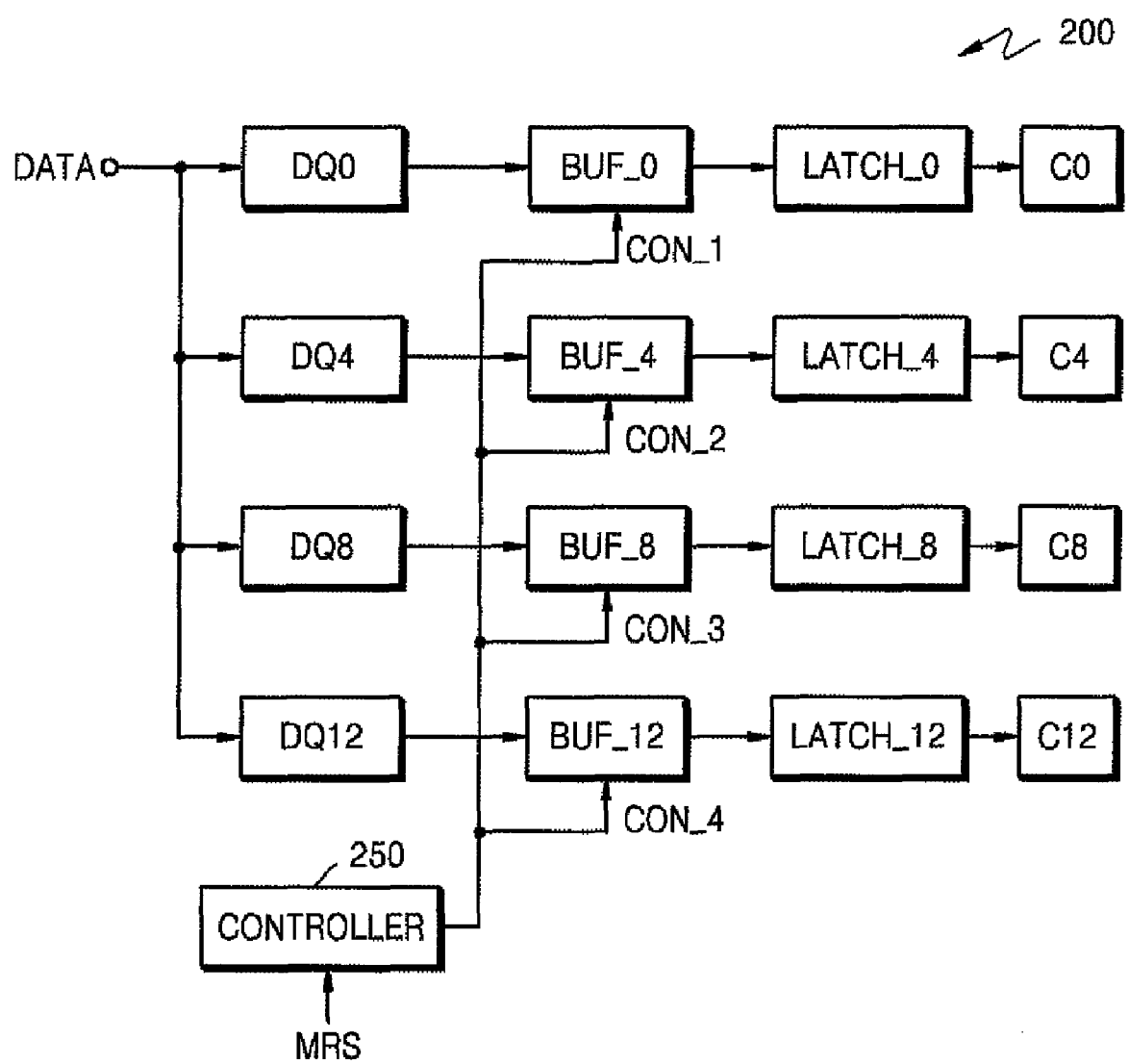
FIG. 2 is a block diagram of a semiconductor device according to an embodiment of the inventive concept.

FIG. 2 is a block diagram of a semiconductor device 200 according to an embodiment of the inventive concept. Referring to FIG. 2, only a relevant teaching portion of the semiconductor device 200 is shown to avoid confusing complexity. In the illustrated portion semiconductor 200 comprises first through fourth terminals DQ0, DQ4, DQ8, and DQ12, corresponding first through fourth buffers BUF_0, BUF_4, BUF_8, and BUF_12, first through fourth latch units LATCH_0, LATCH_4, LATCH_8, and LATCH_12, and first through fourth memory cells C0, C4, C8, and C12, wherein the first through fourth buffers BUF_0, BUF_4, BUF_8, and BUF_12 are controlled in their operation by a control unit 250.

In its constituent operation during a test mode, the semiconductor device 200 is capable of detecting defective memory cells, and unlike analogous conventional semiconductor devices is capable of accurately detecting defective memory cells in the presence of shorted corresponding data lines. During the test mode, it is assumed that similar data (DATA) (i.e., test data having the same digital value) is applied to each one of the first through fourth terminals DQ0, DQ4, DQ8, and DQ12 in the first terminal group illustrated in FIGS. 1 and 2, as an example of all terminals regardless of grouping arrangement or number in a semiconductor device according to an embodiment of the inventive concept.

The control unit 250 is configured to generate and respectively provide first through fourth control signals CON_1, CON_2, CON_3, and CON_4 to the first through fourth buffers BUF_0, BUF_4, BUF_8, and BUF_12. In one embodiment of the inventive concept, the control unit 250 generates the first through fourth control signals CON_1, CON_2, CON_3, and CON_4 in response to an externally supplied mode register set (MRS) signal. Those skilled in the art will recognize that the choice of four (4) control signals arising from similar data simultaneously applied to an arrangement of four (4) terminals of a terminal group is only one selected example of many different schemes wherein "N" terminals in a terminal group are similarly treated. In this manner, the control unit 250 will generate "N" corresponding controls signal to control the 1 through N buffers of the implicated terminals.

In FIG. 2, the first through fourth buffers BUF_0, BUF_4, BUF_8, and BUF_12 pass data received from corresponding terminals DQ0, DQ4, DQ8, and DQ12 to corresponding memory cells C0, C4, C8, and C12 in response to a corresponding control signals CON_1, CON_2, CON_3, and CON_4. Thus, the first buffer BUF_0 receives data via the first terminal DQ0 and passes the data to the first memory cell C0 in response to the first control signal CON_1. The second buffer BUF_4 receives data via the second terminal DQ4 and passes the data to the second memory cell C4 in response to the second control signal CON_2. Likewise, the third buffer BUF_8 receives data via the third terminal DQ8 and passes the data to the third memory cell C8 in response to the third control signal CON_3, and the fourth buffer BUF_12 receives data via the fourth terminal DQ12 and passes the data to the fourth memory cell C12 in response to the fourth control signal CON_4.

During operation in a conventional test mode, for example, buffers similar to buffer BUF_0, BUF_4, BUF_8, and BUF_12 will merely pass data as it is received from a corresponding terminal to a corresponding memory cell without any ability to change the value (e.g., its logic state) of the passing data. This limited functionality makes it impossible to correctly identify one or more defective memory cells when additionally one or more of the signal lines connecting a buffer to a memory cell is short circuited with another signal line (e.g., an adjacent signal line) connecting another buffer with another memory cell.

For example, it is assumed that the first memory cell C0 is defective, and that similar "high" data (i.e., data having a logically high state) is commonly applied to each one of the first through fourth memory cells C0, C4, C8, and C12. Under these assumptions, high data will be properly stored to (and may be subsequently read from) the second through fourth memory cells C4, C8, and C12, but "low" data (i.e., data having a logically low state) apparent in the first memory cell C0 will indicate its defective nature. This conventional approach works well, unless the signal line connecting the first buffer BUF_0 to the first memory cell C0 is shorted with the another signal line (e.g., the signal line connecting the BUF_2 with memory cell C2). When this type of signal line shorting is present, it is impossible to accurately identify the defective first memory cell C0, since the signal shorting may very well return a high data value, despite the actual state of the data stored in the first memory cell C0.

To avoid this test mode failure (or defective memory cell misdetection), embodiments of the inventive concept add the control unit 250 which has the ability to actively control (e.g., selectively change) the value of the data in the buffers as it is passed to corresponding memory cells. This added capability allows embodiments of the inventive concept to accurately determine whether or not a particular memory cell is defective, even with the coincident presence of a shorted signal line.

That is, by selectively generating respective control signals CON_1, CON_2, CON_3, and CON_4 using the control unit 250, the buffers BUF_0, BUF_4, BUF_8, and BUF_12 may be actively controlled to apply either "data" (i.e., the data received from a corresponding terminal) or "changed data" (e.g., an inverted version of the data received from a corresponding terminal).

With reference again to FIG. 2, it is now assumed that the first buffer BUF_0 is controlled to provided changed data in response to the first control signal CON_1 while the second through fourth buffers BUF_4, BUF_8, and BUF_12 are controlled to provide data in response to the second through fourth control signals CON_2, CON_3, and CON_4. If the similarly applied data is high, the first buffer BUF_0 will output low data while the second through fourth buffers BUF_4, BUF_8, and BUF_12 will output high data.

Now, if the signal line connecting the first buffer BUF_0 with the first memory cell C0 (i.e., any portion of the signal pathway between the first buffer BUF_0 and the first memory cell C0 including the first latch LATCH_0) is shorted to a nearby signal line, the data actually applied to the first memory cell C0 will be high (e.g., the high data currently being applied to the second memory cell C4). Upon subsequently reading the data actually stored in the first through fourth memory cells C0, C4, C8 and C12 (e.g., 1, 1, 1, 1) instead of (0, 1, 1, 1) as provided by the first through fourth buffers BUF_0, BUF_4, BUF_8, and BUF_12, it may be accurately determined that a signal line is shorted.

Thus, according to a test mode performed in a semiconductor device according to an embodiment of the inventive concept, each buffer may be controlled to selectively pass either "data" or "changed data" to a corresponding memory cell. Inverted data has been described as one simple example of changed data provide by a buffer in response to a control signal, but those skilled in the art will recognize that other changes (e.g., incrementing or decrementing) may be similarly made to the originally received data particularly when multi-bit data is being stored. An exemplary approach will be described in some additional detail with reference to FIGS. 3 and 4.

Consistent with the foregoing embodiments, it is assumed that data or changed data (e.g., inverted data) is passed from each buffer to a corresponding memory cell through a corresponding latch unit. The latch unit latches and outputs the data received from the corresponding buffer. That is, the first latch unit LATCH_0 latches and outputs an output signal of the first buffer BUF_0 to the first memory cell C0, and the second latch unit LATCH_4 latches and outputs an output signal of the second buffer BUF_4 to the second memory cell C4. Likewise, the third latch unit LATCH_8 latches and outputs an output signal of the third buffer BUF_8 to the third memory cell C8, and the fourth latch unit LATCH_12 latches and outputs an output signal of the fourth buffer BUF_12 to the fourth memory cell C12.

Figure 3:
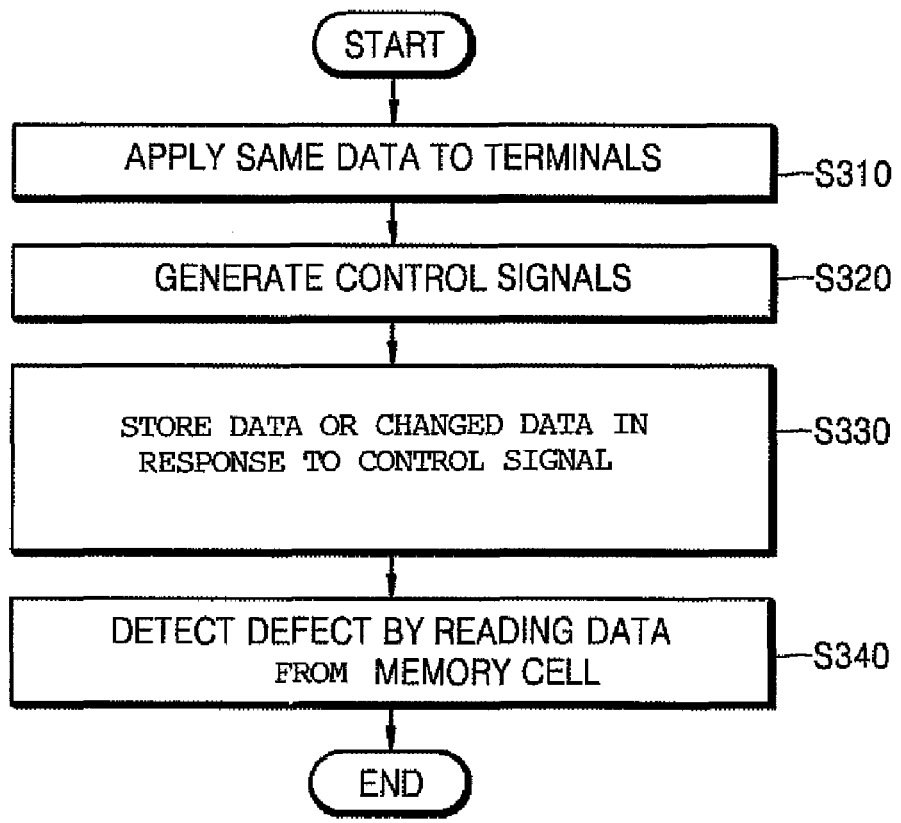
FIG. 3 is a flowchart summarizing a test method according to an embodiment of the inventive concept.

FIG. 3 is a flowchart summarizing a test method according to an embodiment of the inventive concept. Referring to FIGS. 2 and 3, similar data is applied to a plurality of terminals (S310), and a plurality of control signals is generated by control unit 250 (S320). The similar data applied to each terminal in the plurality of terminals is then stored in its original data state (i.e., as "data") or in a changed data state (i.e., as "changed data") to a corresponding memory cell (S330). Then, a defective memory cell may be detected by reading the stored data (S340).

For example in the context of the foregoing method, it is first assumed that high, single-bit, similar data (DATA) is applied to the first through fourth terminals DQ0, DQ4, DQ8, and DQ12. It is further assumed that a signal line connecting the first buffer BUF_0 and the first memory cell C0 is shorted with another signal line connecting the second buffer BUF_4 and the second memory cell C4.

In the absence of the control unit 250 and its applied functionality, the shorted signal lines would result in high data being stored in each one of the first through fourth memory cells C0, C4, C8, and C12. Thus, if either one of the first memory cell C0 or second memory cell C4 is defective, its defective nature would be effectively obscured by the shorted signal lines since high data would be subsequently read from the first and second memory cells C0 and C4.

But according to embodiments of the inventive concept, this type of signal line shorting could be effectively detected. In the above case, the control unit 250 might generate the first control signal CON_1 having a second control state, and second through fourth control signals CON_2, CON_3, and CON_4 having a first control state. For example, the first control state may be a high control signal and the second control state may be a low control signal.

In response to these disparate control signals, the first buffer BUF_0 will output received data as "data" in response to the first control signal CON_1, while the second through fourth buffers BUF_4, BUF_8 and BUF_12 will output received data as "changed data" in response to the second through fourth control signals CON_2, CON_3, and CON_4.

Thus, the first buffer BUF_0 will outputs high data in response to the first control signal CON_1 having the second control state, while the second through fourth buffers BUF_4, BUF_8, and BUF_12 will output low data in response to the second through fourth control signals CON_2, CON_3, and CON_4 having the first control state, respectively.

However, due to the shorted signal lines connecting the first buffer BUF_0 and the first memory cell C0 and connecting the second buffer BUF_4 and the second memory cell C4, high data will be stored in the first and second memory cells C0 and C4, while low data will be stored in the third and fourth memory cell C8 and C12. In the absence of the shorted signal lines, high data would be read from the first memory cell C0 and low data would be read from the second through fourth memory cells C4, C8, and C12. However, due to the shorted signal lines, high data will be read from the second memory cell C4. Accordingly, the presence of the shorted signal lines may be detected by storing (e.g., writing or programming) data to, and then reading data from the first through fourth memory cells C0, C4, C8, and C12.

Of course, the scope of the inventive concept is not limited to only the foregoing type, number, or logic level assertions for the control signals taught above.

Figure 4:
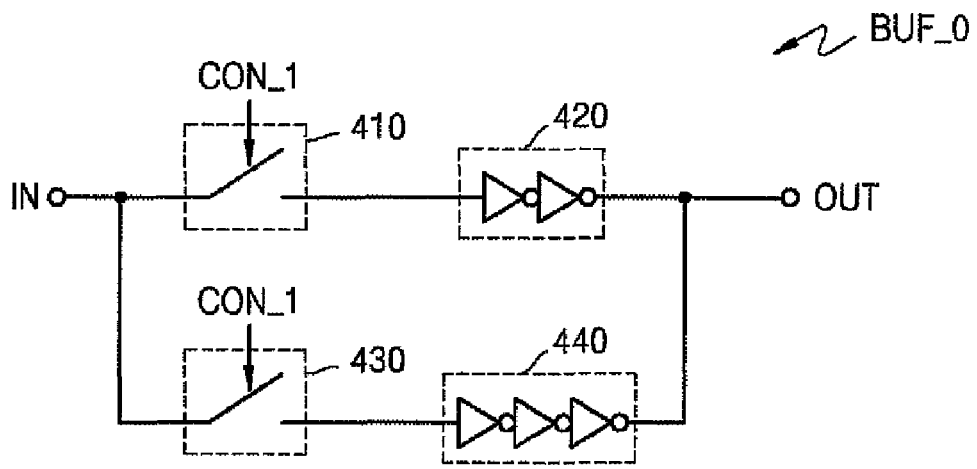
FIG. 4 is a circuit diagram further illustrating the first buffer in FIG. 2.

FIG. 4 is a circuit diagram of one possible embodiment implementing the first buffer BUF_0 of FIG. 2, as an example of each buffer in the plurality of buffers. Other circuits may be used to implement one or more buffers in the plurality of buffers, so long as said circuit design provides a buffer capable of passing "data" or "changed data" in response to a control signal.

Referring to FIGS. 2 and 4, the first buffer BUF_0 comprises a first switch 410, a buffering unit 420, a second switch 430, and an inversion unit 440. Data output from the first terminal DQ0 is indicated as input signal IN and data output to the first latch unit LATCH_0 is indicated as output signal OUT. The first switch 410 is turned ON/OFF in response to the first control signal CON_1. If the first switch 410 is turned ON, the buffering unit 420 outputs the input signal IN as the output signal OUT without changing the state of the input signal IN. In order not to change the logic state of the input signal IN, the buffering unit 420 may include an even number of inverters. The second switch 430 is also turned ON/OFF in response to the first control signal CON_1. If the second switch 430 is turned ON, the inversion unit 440 outputs the input signal IN as the output signal OUT by changing (e.g., inverting) the logic state of the input signal IN. In order to change (invert) the logic state of the input signal IN, the inversion unit 440 may include an odd number of inverters.

Only one of the first and second switches 410 and 430 is turned ON while the other is turned OFF in response to the first control signal CON_1. For example, the second switch 430 may be turned ON if the first control signal CON_1 has the first control state and the first switch 410 may be turned ON if the first control signal CON_1 has the second control state. Thus, if the first control signal CON_1 has the first control state, the input signal IN is inverted and changed data is output as the output signal OUT. If the first control signal CON_1 has the second control state, the input signal IN and data is output as the signal OUT without being inverted.

While the inventive concept has been particularly shown and described with reference to exemplary embodiments thereof, it will be understood that various changes in form and details may be made therein without departing from the scope of the following claims.

What is claimed is:

1. A semiconductor device comprising:
a plurality of terminals, each terminal being configured to receive similar data during a test mode;
a plurality of buffers, each buffer being configured to receive data from a corresponding terminal and output either the data or changed data to a corresponding memory cells in response to a control signal; and
a control unit configured to generate a plurality of control signals, each control signal being respectively applied to a corresponding buffer,
wherein each of the plurality of buffers comprises:
a first switch configured to receive the data and be turned ON/OFF in response to a corresponding one of the plurality of control signals;
a buffering unit configured to pass the data received from the first switch without changing a logic state of the data;
a second switch configured to receive the data and be turned ON/OFF in response to the corresponding one of the plurality of control signals; and
an inversion unit configured to invert the logic state of the data received from the second switch and pass the inverted data as changed data.

2. The semiconductor device of claim 1, wherein the control unit is further configured to generate a first control signal having a first control state and apply the first control signal to a first buffer in the plurality of buffers, and generate a second control signal having a second control state different from the first control state and apply the second control signal to a second buffer in the plurality of buffers,
such that the first buffer outputs one of the data or the changed data in response to the first control signal and the second buffer outputs the other one of the data or the changed data in response to the second control signal, whereby a short circuit is detected between a first signal line connecting the first buffer and a corresponding memory cell and a second signal line connecting the second buffer and a corresponding memory cell.

3. The semiconductor device of claim 1, wherein during the test mode, the corresponding one of the control signals controls the first and second switches such that only one of the first and second switches is turned ON at any given time.

4. The semiconductor device of claim 1, wherein the control unit is further configured to generate the plurality of control signals in response to a mode register set (MRS) signal.

5. The semiconductor device of claim 1, wherein each one of the plurality of terminals is a data input/output (DQ) pin or a data strobe (DQS) pin.

6. The semiconductor device of claim 1, further comprising:
a plurality of latch units, each latch unit being configured to respectively connect one of the plurality of buffers with a corresponding memory cell.

7. A method of testing a plurality of memory cells in a semiconductor device, test method comprising:
applying similar data to a plurality of terminals, wherein each one of the plurality of terminals is connected to a corresponding memory cell by one of a plurality of buffers;
generating a plurality of control signals, each control signal being respectively applied to one of the plurality of buffers;
by operation of each buffer in response to a corresponding control signal, storing received data as either data or changed data in the corresponding memory cell; and
detecting whether a memory cell is defective by reading the data actually stored in the memory cell,
wherein storing received data as either data or changed data in the corresponding memory cell comprises:
receiving the data in a first switch turned ON/OFF in response to a corresponding one of the plurality of control signals;
passing the data received from the first switch through a buffering unit as data without changing a logic state of the data;
receiving the data in a second switch turned ON/OFF in response to the corresponding one of the plurality of control signals; and
passing the data received from the second switch through an inversion unit as changed data after changing the logic state of the data.

8. The method of claim 7, wherein generating the plurality of control signals comprises:
generating a first control signal having a first control state and applying the first control signal to a first buffer in the plurality of buffers; and
generating a second control signal having a second control state different from the first control state and applying the second control signal to a second buffer in the plurality of buffers,
such that the first buffer outputs one of the data or the changed data in response to the first control signal and the second buffer outputs the other one of the data or the changed data in response to the second control signal, whereby a short circuit is detected between a first signal line connecting the first buffer and a corresponding memory cell and a second signal line connecting the second buffer and a corresponding memory cell.

9. The method of claim 7, wherein the generating of the plurality of control signals comprises generating the plurality of control signals in response to a mode register set (MRS) signal.

10. The method of claim 7, further comprising:
latching the data or the changed data provided by each one of the plurality of buffers before storing the data or changed data in the corresponding memory cell.

11. The method of claim 7, wherein only one of the first and second switches is turned ON by the corresponding one of the plurality of control signals at any given time during the test mode.

12. The method of claim 7, wherein each one of the plurality of terminals is a data input/output (DQ) pin or a data strobe (DQS) pin.

* * * * *